(12) United States Patent
Huang et al.

(10) Patent No.: US 9,196,493 B2
(45) Date of Patent: Nov. 24, 2015

(54) SEMICONDUCTOR DEVICE AND METHOD OF MANUFACTURING THEREOF

(75) Inventors: Yude Huang, Taipei (TW); Junmin Zheng, Hsinchu (TW)

(73) Assignee: Macronix International Co., Ltd., Hsin-chu (TW)

( * ) Notice: Subject to any disclaimer, the term of this patent is extended or adjusted under 35 U.S.C. 154(b) by 0 days.

(21) Appl. No.: 13/435,546

(22) Filed: Mar. 30, 2012

(65) Prior Publication Data

US 2013/0256620 A1    Oct. 3, 2013

(51) Int. Cl.
*H01L 29/788* (2006.01)
*H01L 21/28* (2006.01)
*H01L 29/66* (2006.01)
*H01L 29/423* (2006.01)

(52) U.S. Cl.
CPC .... *H01L 21/28273* (2013.01); *H01L 29/42324* (2013.01); *H01L 29/66825* (2013.01)

(58) Field of Classification Search
CPC .......... H01L 27/11563; H01L 27/11568; H01L 27/1157; H01L 27/11517; H01L 27/11521; H01L 27/11524
USPC ............ 257/321, 324, 326, 316, E29.129
See application file for complete search history.

(56) References Cited

U.S. PATENT DOCUMENTS

| | | | | |
|---|---|---|---|---|
| 5,298,447 A * | 3/1994 | Hong | | 438/264 |
| 6,153,470 A * | 11/2000 | He et al. | | 438/257 |
| 6,235,586 B1 * | 5/2001 | Au et al. | | 438/258 |
| 6,455,890 B1 * | 9/2002 | Chang et al. | | 257/321 |
| 6,812,515 B2 * | 11/2004 | Rabkin et al. | | 257/315 |
| 7,736,963 B2 * | 6/2010 | Lee et al. | | 438/197 |
| 2009/0181528 A1 * | 7/2009 | Park et al. | | 438/585 |
| 2012/0018888 A1 * | 1/2012 | Ko | | 257/751 |

* cited by examiner

*Primary Examiner* — Matthew W Such
*Assistant Examiner* — Scott Stowe
(74) *Attorney, Agent, or Firm* — Alston & Bird LLP

(57) ABSTRACT

An improved semiconductor device results from the use of an amorphous silicon layer in a gate structure disposed between a dielectric layer and an upper conductive layer such as a control gate. Both a semiconductor device and method of manufacturing a semiconductor device using an amorphous silicon layer are provided.

25 Claims, 9 Drawing Sheets

SEMICONDUCTOR DEVICE AND METHOD OF MANUFACTURING THEREOF

TECHNOLOGICAL FIELD

Embodiments of the present invention relate generally to a semiconductor device, in particular, a non-volatile memory (NVM) semiconductor device.

BACKGROUND

Erasable programmable read-only memory (EPROM), electrically erasable read-only memory (EEPROM), and flash memory devices consist of a plurality of gate structures. These gate structures generally comprise a control gate and a floating gate that is positioned between the control gate and a substrate. The floating gate is a conductive layer normally fabricated of a polysilicon material. The floating gate is not attached to any electrodes or power sources and is itself generally surrounded by an insulation material.

The operation of EEPROM non-volatile memory devices, such as a floating gate tunnel oxide (FLOTOX) EEPROM, is dependent upon the charge stored in the floating gate at the threshold voltage needed to represent information stored in these devices.

The performance of EEPROM devices typically includes a performance specification or rating of the programming speed that influences the speed of erase and write operations. The speed is typically limited by the rate at which electrons can be pumped into (writing) and out of (erasing) the device without causing damage to the device. Typically, erasing and writing operations must be capable of operating within 1 msec at a specified applied voltage.

As the dimensions of memory devices continue to be reduced, the thickness of each of the layers must also be reduced. While, for example, a thinner tunneling oxide layer may increase data writing and erasing efficiency as well as speed, smaller tunneling oxide layers may be more susceptible to damage upon exposure to recording or erasing energies. There remains a need in the art for improved processing strategies for responding to the demands created by the drive to achieve even smaller memory devices.

Additionally, smaller dimensions may require greater uniformity in memory device layers to ensure the device works for its intended purpose. There remains a need in the art for memory devices and processing techniques to improve the product and operational performance of such devices.

BRIEF SUMMARY OF EXEMPLARY EMBODIMENTS

Embodiments of the present invention provide semiconductor devices, in particular, non-volatile memory (NVM) semiconductor devices.

An aspect of the invention provides a gate structure for a semiconductor device, or more specifically a memory device, comprising a dielectric layer, an amorphous silicon layer, and a conductive layer such as a floating gate and/or a control gate.

In certain embodiments of the invention, the conductive layer is an upper conductive layer. In certain embodiments of the invention, the conductive layer is a lower conductive layer.

According to an embodiment where the conductive layer is an upper conductive layer, the amorphous silicon layer is disposed between the dielectric layer and the upper conductive layer. Further according to this embodiment, the gate structure may additionally comprise a lower conductive layer that is adjacent to but electrically isolated from the dielectric layer.

In an embodiment of the invention, a thickness of the amorphous silicon layer is in a range of from about 50 Å to about 1000 Å. In an exemplary embodiment of the invention, the thickness of the amorphous silicon layer is about 300 Å.

According to an embodiment of the invention, the dielectric layer comprises a first oxide layer, a nitride layer, and a second oxide layer, the nitride layer disposed between the first oxide layer and the second oxide layer. The second oxide layer may be defined by a multiplicity of thicknesses. In particular, the second oxide layer is defined by a first thickness at about a middle of the dielectric layer and a second thickness at about an outside periphery of the dielectric layer.

Notably, according to an embodiment of the invention, the first thickness is substantially the same as the second thickness. Yet, according to an embodiment of the invention, a ratio of the second thickness to the first thickness is less than about 1.35.

The gate structure of the invention may additionally comprise a lower conductive layer adjacent to the dielectric layer.

In yet another embodiment of the invention, the gate structure comprise an amorphous silicon layer disposed between an upper conductive layer and a dielectric layer, while another amorphous silicon layer is disposed between the dielectric layer and a lower conductive layer.

An aspect of the invention provides methods for manufacturing a gate structure of a semiconductor, in particular a memory device, comprising the steps of forming a tunnel oxide layer onto a substrate, forming a lower conductive layer over the tunnel oxide layer, forming a dielectric layer over the lower conductive layer, applying an amorphous silicon layer disposed between the dielectric layer and an upper conductive layer, and forming the upper conductive layer over the amorphous silicon layer. In an embodiment, forming the upper conductive layer comprises the step of applying a polysilicon layer over the amorphous silicon layer.

In an embodiment of the invention, the step of forming an amorphous silicon layer is accomplished using a chemical vapor deposition process. According to certain embodiments, the chemical vapor deposition process may be any one of a plasma-enhanced chemical vapor deposition, a plasma-assisted chemical vapor deposition, a plasma-promoted chemical vapor deposition, a low pressure chemical vapor deposition, and an atmospheric pressure chemical vapor deposition. The temperature of the chemical vapor deposition may be in a range of from about 400° C. to about 700° C., and the pressure of the chemical vapor deposition may be in a range of from about 0.2 torr to about 760 torr.

A method of the invention may further include the steps of etching the polysilicon layer to form the upper conductive layer, depositing an insulating layer over the etched polysilicon layer, performing a first anneal of the gate structure, and performing a cell reoxidation in the presence of oxygen.

A method of invention may result in a gate structure having a dielectric layer comprising a first oxide layer, a nitride layer, and a second oxide layer, the nitride layer disposed between the first oxide layer and the second oxide layer, the second oxide layer having at least two thicknesses, a first thickness at about a middle of the dielectric layer and a second thickness at about a periphery of the dielectric layer.

According to an embodiment of the invention, the ratio between the second thickness and the first thickness is less than about 1.35. In yet another embodiment of the invention, the first thickness is substantially the same as the second thickness.

An aspect of the invention also provides a gate structure for a memory device having a dielectric layer and an upper conductive layer. According to this embodiment, the upper conductive layer comprises at least two layers with each of these layers having a grain size that is different and a dopant concentration that is different. In an embodiment of the invention, the dopant concentration in the layer having a large grain size material is greater than the dopant concentration in the layer having a small grain size material.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1:
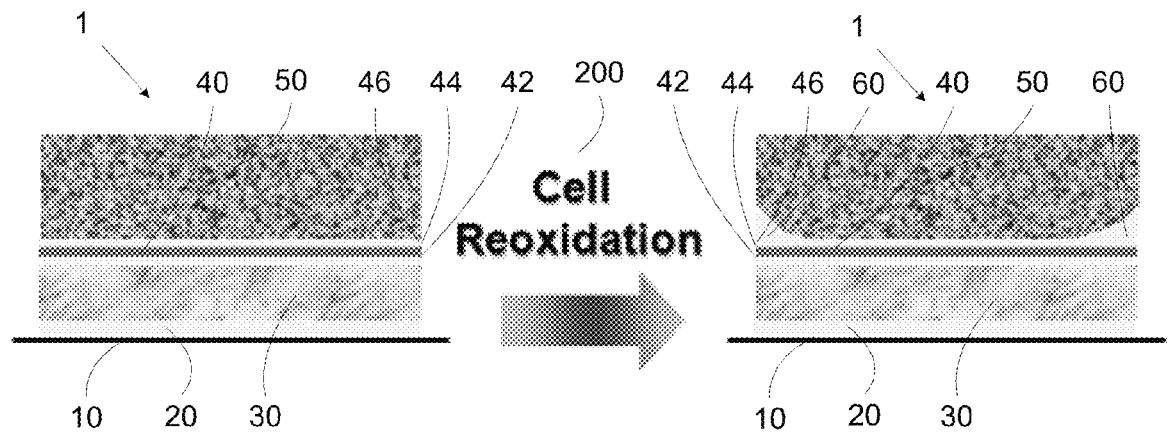
FIG. 1 illustrates dielectric encroachment on a gate structure of a flash memory following cell reoxidation.

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate structure" includes a plurality of such gate structures.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "gate structure" refers to a component of a semiconductor device, more particularly a memory device. Non-limiting examples of memory devices include flash memory devices. Erasable programmable read-only memory (EPROM) and electrically erasable read-only memory (EEPROM) devices are non-limiting examples of flash memory devices.

A gate structure generally may include an upper conductive layer or a control gate and a lower conductive layer or a floating gate. The control gate may be more generally defined herein as an upper conductive layer, while the floating gate may be more generally defined herein as a lower conductive layer. The floating gate is configured to hold a charge at a threshold voltage. A plurality of these representations in a memory device is used to identify information, typically information that is needed by a processing system.

The inventors have conceived of and have developed memory devices and methodologies for manufacturing such devices that substantially reduces or eliminates the extent of dielectric encroachment experienced by the memory device. In particular, the inventors have conceived of and developed EEPROM devices and methodologies for the manufacture of such devices that substantially reduces or eliminates the extent of dielectric encroachment experience by the inventive EEPROM devices or EEPROM devices manufactured by the inventive methods.

A gate coupling ratio may be used as a measurement of the performance of a memory device. The gate coupling ratio, GCR, is defined according to equation (1) below.

$$GCR = \frac{C_{ONO}}{C_{ONO} + C_{TOX}} \quad (1)$$

where:
GCR=gate coupling ratio
$C_{ONO}$=capacitance of oxide/nitride/oxide (ONO) dielectric layer
$C_{TOX}$=capacitance of tunnel oxide layer
For theoretical perfect coupling, the gate capacitance ratio is equal to 100%, which means that the capacitance of the tunnel oxide layer would be driven to zero. Generally, increasing the gate capacitance ratio lowers the operating voltage of the memory device and increases the speed of the memory device. However, dielectric encroachment results in an asymmetric structure causing a non-uniform gate coupling ratio to be experienced across the gate. In particular, the areas of encroachment tend to be defined by a capacitance that will result in a reduction in the gate coupling ratio in these regions.

The invention provides a memory device and methods of manufacturing such a device that substantially reduces or eliminates dielectric encroachment that would otherwise be experienced in the memory device.

In an aspect, the invention provides a gate structure generally comprising a dielectric layer, a conductive layer, and an amorphous silicon layer disposed between the dielectric layer and the conductive layer. According to various embodiments of the invention, the conductive layer may be an upper conductive layer or a lower conductive layer. In other embodiments of the invention amorphous silicon layers may even be disposed between the lower conductive layer and the dielectric layer and between the dielectric layer and the upper conductive layer.

FIG. 1 illustrates cell reoxidation of a gate structure of a memory device. The gate structure 1 comprises a substrate 10, a tunnel oxide layer 20, a lower conductive layer such as a floating gate 30, a dielectric layer 40, and an upper conductive layer such as a control gate 50. As used herein, the positions of a lower layer and an upper layer, such as a lower conductive layer acting as a floating gate 30 and an upper conductive layer acting as a control gate 50, are relative to the substrate 10 of the gate structure 1.

Upon being subjected to cell reoxidation 200, the gate structure 1 experiences the formation of encroachments 60 in the dielectric layer 40. Reoxidation is generally conducted in the presence of oxygen at an elevated temperature for the purpose of growing an oxide layer over the exposed surfaces of the control gate 50 and the floating gate 30. The formation of the dielectric encroachments 60 are an unwanted side effect.

As shown in FIG. 1, the dielectric layer 40 may be a dielectric layer that is similar to a lamination structure having multiple layers including a lower oxide film 42, a nitride film 44, and an upper oxide film 46. Encroachment 60 in the dielectric layer 40 may mostly be experienced in the upper oxide film 46 at the interface of the upper oxide film 46 and the control gate 50. As used herein, any discussion concerning encroachment 60 of the dielectric layer 40 may be interpreted to primarily mean the encroachment 60 experienced in the upper oxide film 46 of the dielectric layer 40 such as that illustrated in FIG. 1.

Figure 2:
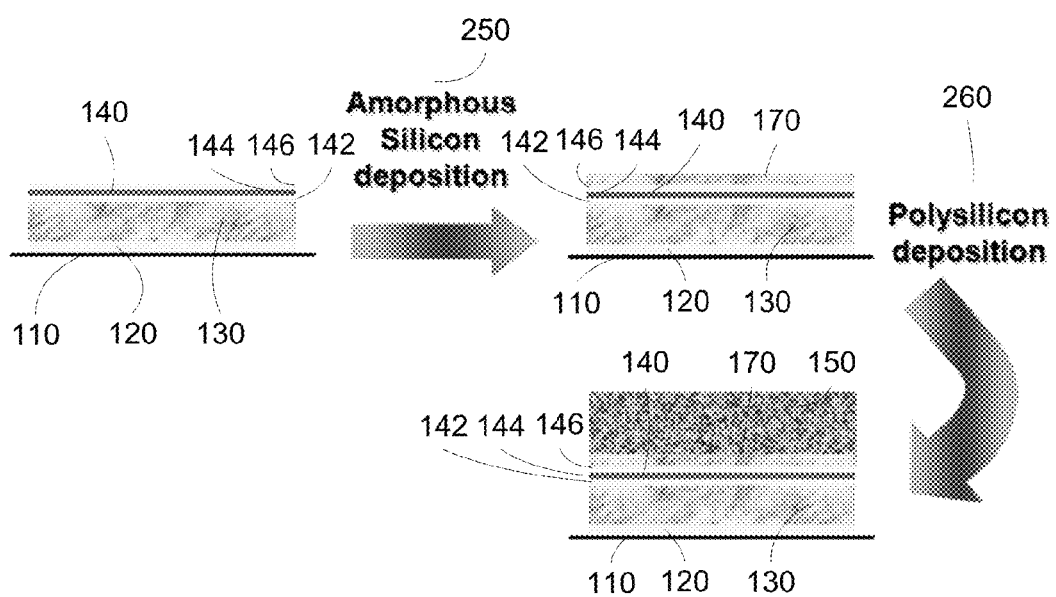
FIG. 2 illustrates amorphous silicon deposition followed by polysilicon deposition according to an exemplary embodiment of the invention.

A memory device and processes for manufacturing such a memory device, according to an embodiment of the invention, are illustrated in FIG. 2. FIG. 2 illustrates a partially formed gate structure having a substrate 110, a tunnel oxide layer 120, a lower conductive layer 130, and a dielectric layer 140. In this exemplary embodiment, the lower conductive layer is a polysilicon layer such as a floating gate in this gate structure. This partially formed gate structure is subjected to an amorphous silicon deposition step 250 that results in the formation of an amorphous silicon layer 170. The gate structure is then subjected to a polysilicon deposition step 260 resulting in the formation of an upper conductive layer 150 functioning, for example, as a control gate in this gate structure.

Therefore, in an embodiment of the invention, the gate structure includes a tunnel oxide layer 120 on a substrate 110, a lower conductive layer 130 on the tunnel oxide layer 120, a dielectric layer 140 on the lower conductive layer 130, an amorphous silicon layer 170 on the lower conductive layer 130, and an upper conductive layer 150. The amorphous silicon layer 170 is disposed between the dielectric layer 140 and the upper conductive layer 150. As further illustrated in the figures that follow, the inventors have discovered that the amorphous silicon layer 170 or the amorphous silicon deposition step 250 substantially reduces and/or eliminates altogether the formation of encroachments in the dielectric layer 140.

Figure 3:
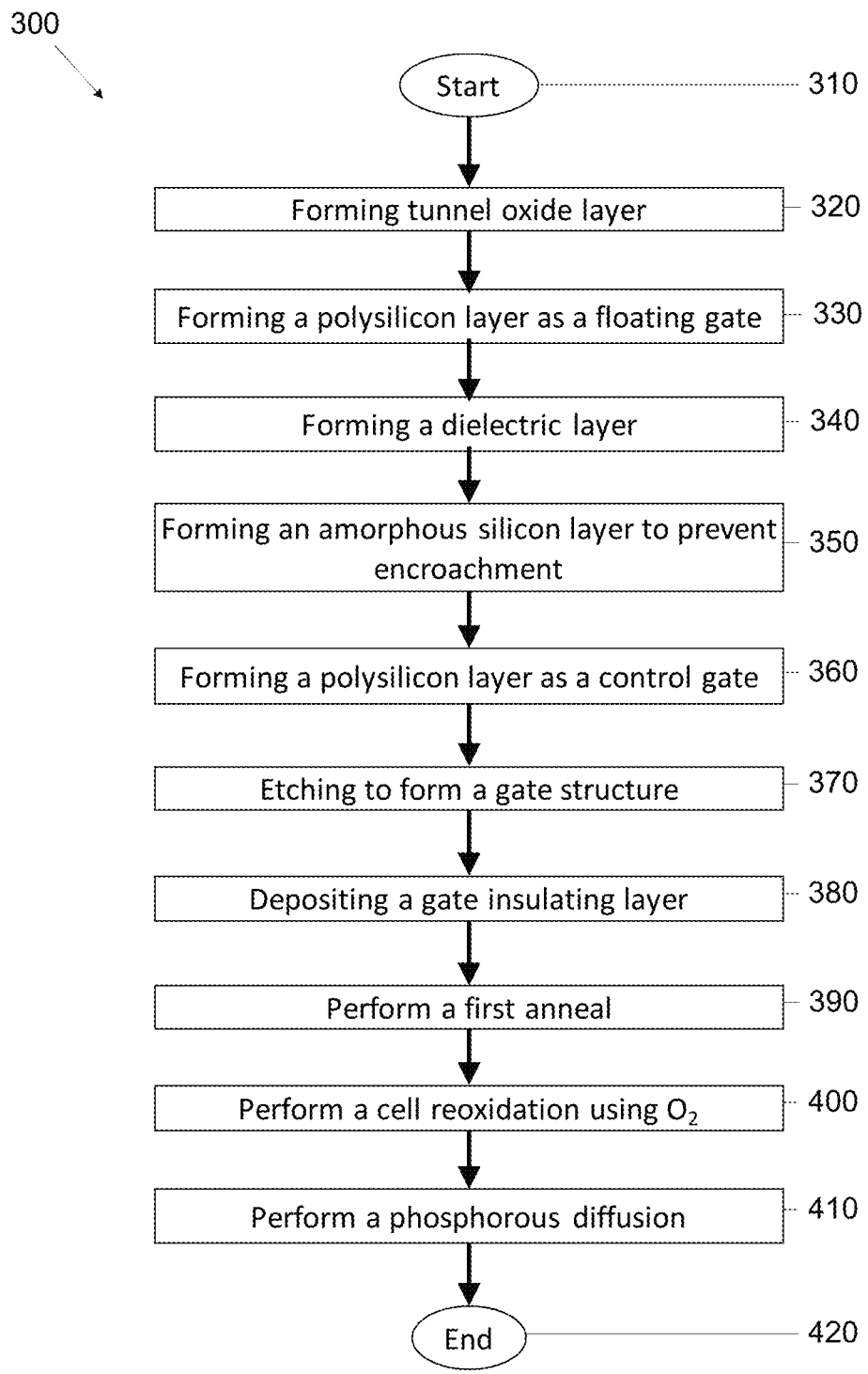
FIG. 3 is a process flow diagram showing a method of manufacturing a gate structure according to an embodiment of the invention.

FIG. 3 illustrates a process flow diagram showing a method of fabricating a gate structure of a memory device according to an embodiment of the invention. The inventive method for fabricating or manufacturing a gate structure 300 of a memory device begins with providing the materials needed to form the gate structure 310. According to this exemplary embodiment, the inventive method 300 includes the step of forming a tunnel oxide layer 320 onto a substrate, followed by forming a floating gate 330, which may be itself constructed of a polysilicon layer over the tunnel oxide layer. A next step in the inventive method 300 includes forming a dielectric layer 340, which is followed by the step of forming an amorphous silicon layer 350. A control gate is added by forming a polysilicon layer 360 over the amorphous silicon layer.

In some embodiments of the invention, the dielectric layer is similar to a lamination structure having a lower oxide film, a nitride film, and an upper oxide film. Any technique known in the art may be used in forming the dielectric layer 340. By way of example, without intending to be limiting, the films of the dielectric may be formed by a series of chemical vapor deposition operations in forming the lamination structure of the dielectric layer.

The amorphous silicon layer that is formed between the dielectric layer and the polysilicon layer that defines the upper conductive layer or the control gate is responsible for substantially reducing or preventing the formation of dielectric encroachments that may otherwise develop in the gate structure.

The amorphous silicon layer may be formed using any deposition technique known in the art. For example, the amorphous silicon layer may be applied using a chemical vapor deposition technique. Examples of chemical vapor deposition include, but are not necessarily limited to, plasma-enhanced chemical vapor deposition (PECVD), plasma-assisted chemical vapor deposition (PACVD), plasma-promoted chemical vapor deposition (PPCVD), low pressure chemical vapor deposition (LPCVD), and atmospheric pressure chemical vapor deposition (APCVD).

The application of the amorphous silicon layer using chemical vapor deposition may occur at any temperature know in the art. A chemical vapor deposition may be carried out at any temperature in a range of from about 100° C. to about 750° C. Typically, high temperature process chemical deposition is preferred operating in a range of temperatures of from about 400° C. to about 700° C., from about 450° C. to about 700° C., from about 500° C. to about 700° C., from about 550° C. to about 700° C., and from about 600° C. to about 700° C. In other embodiments of the invention, the temperature of chemical vapor deposition can be in the range of from about 685° C. to about 715° C. Many times, the temperature at which chemical vapor deposition is carried out is dependent upon the type of chemical vapor deposition.

The pressure at which the chemical vapor deposition is carried out many times depends upon the type of chemical vapor deposition process. For example, the pressure at which chemical vapor deposition is carried out may be any pressure in the range of from about 0.2 torr to about 760 torr.

Deposition processes are typically followed by a post-deposition annealing process. Annealing is treatment of the device with heat to improve properties such as strength and hardness of the applied material. Annealing is typically carried out in an atmosphere that is substantially free of oxygen to prevent oxidation of the materials. For example, annealing may be conducted at any temperature in a range of from about 500° C. to about 1,200° C. and any pressure in a range of from about 0.2 torr to about 760 torr. Any atmosphere that is substantially free of oxygen may be used. Preferred gases include nitrogen, argon, hydrogen, etc. In certain embodiments of the invention, the annealing atmosphere may include oxygen.

In certain embodiments of the invention, the extent of or severity of thermal annealing may be increased to offset the extent of or severity of reoxidation to further assist with substantially reducing or eliminating the amount of encroachment that is experienced in the dielectric layer.

The inventive method 300 also includes etching to form a gate structure 370, depositing a gate insulating layer 380, performing a first anneal 390, and performing a cell reoxidation using oxygen 400. Subsequently, the inventive method may include performing a diffusion step such as a phosphorus diffusion step 410. The inventive process concludes with the formation of a gate structure 420 that is substantially free of encroachments in the dielectric layer.

Figure 4A:
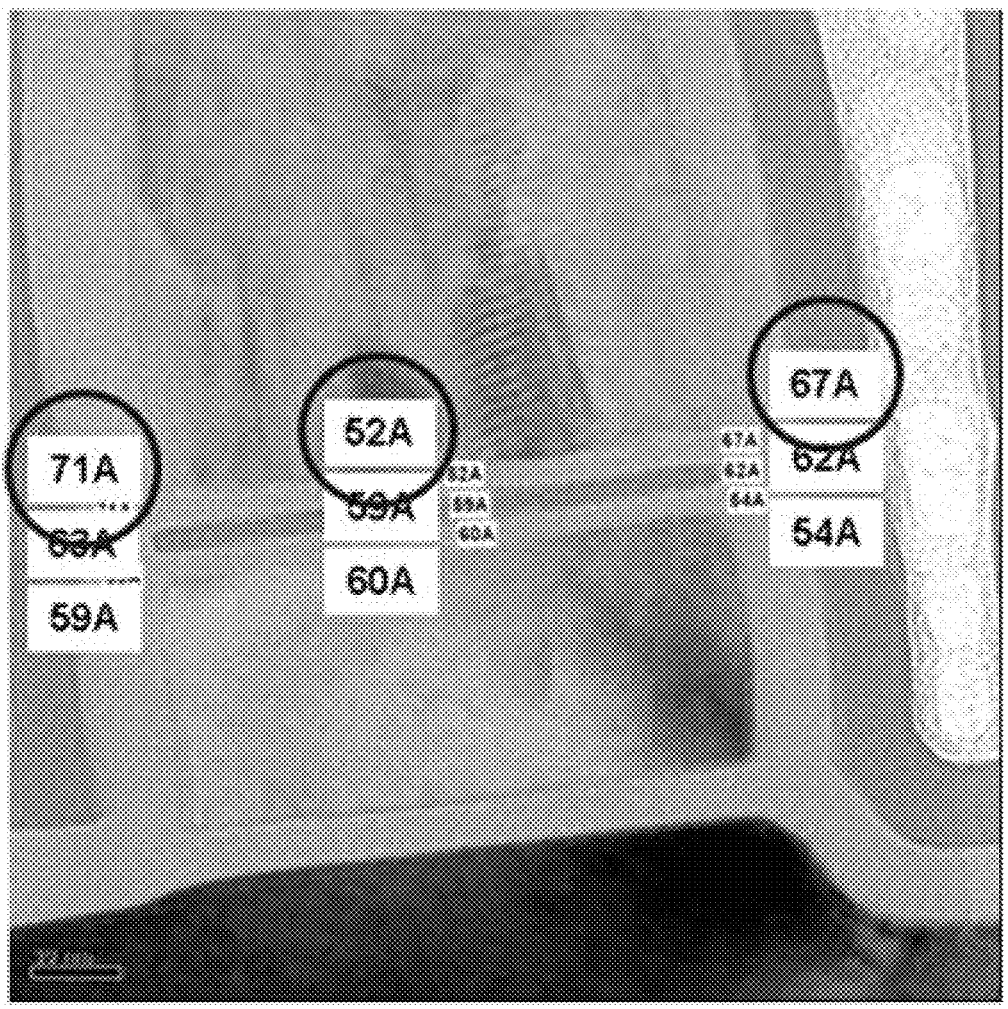
FIG. 4a illustrates dielectric encroachment following cell reoxidation without the use of an amorphous silicon layer.

FIG. 4a illustrates dielectric encroachment following cell reoxidation without the use of an amorphous silicon layer. As shown in FIG. 4a, the dielectric layer comprises a first oxide layer; a nitride layer, for example, a silicon nitride layer that is over the first oxide layer; and a second oxide layer over the nitride layer. The second oxide layer may be defined by a multiplicity of thicknesses. According to FIG. 4a, the second oxide layer is defined by a first thickness at about the middle or center of the second oxide layer and a second thickness at about the outside periphery of the second oxide layer. According to the embodiment illustrated in FIG. 4a, the first thickness is about 52 Å while the second thickness is either about 71 Å or about 67 Å.

In this exemplary gate structure representative of memory devices and methods of producing these memory devices, encroachment is a deviation by as much as 25% or more over the thickness of the dielectric layer. In the example of FIG. 4a, which shows dielectric encahnment following cell reoxidation without the use of an amorphous polysilicon layer, the extent of encroachment is 71 Å and 67 Å, the second thickness, which is above the 52 Å, the first thickness, of the upper oxide film of the dielectric layer. Hence, the amount of encroachment is 19 Å and 15 Å, respectively.

Figure 4B:
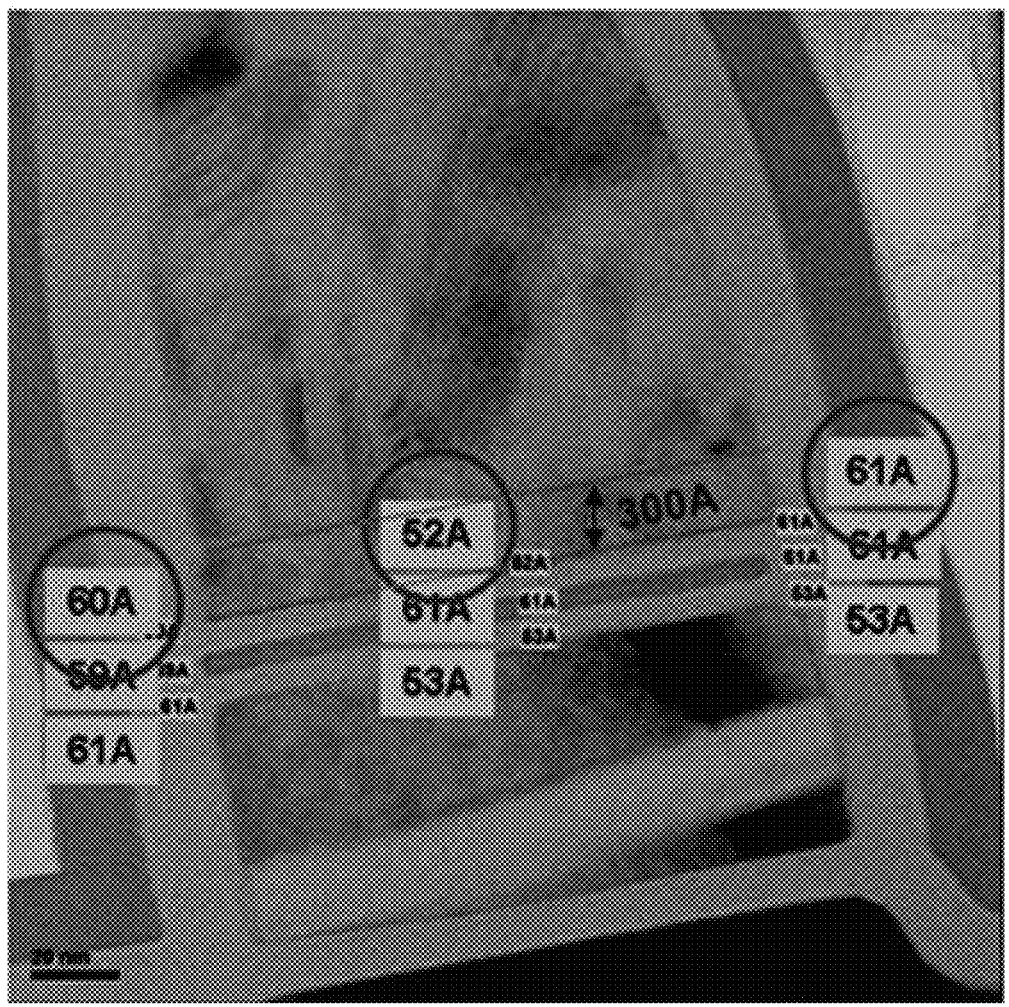
FIG. 4b illustrates a cell having amorphous silicon that is substantially free of dielectric encroachment following reoxidation according to an embodiment of the invention.
Figure 4C:
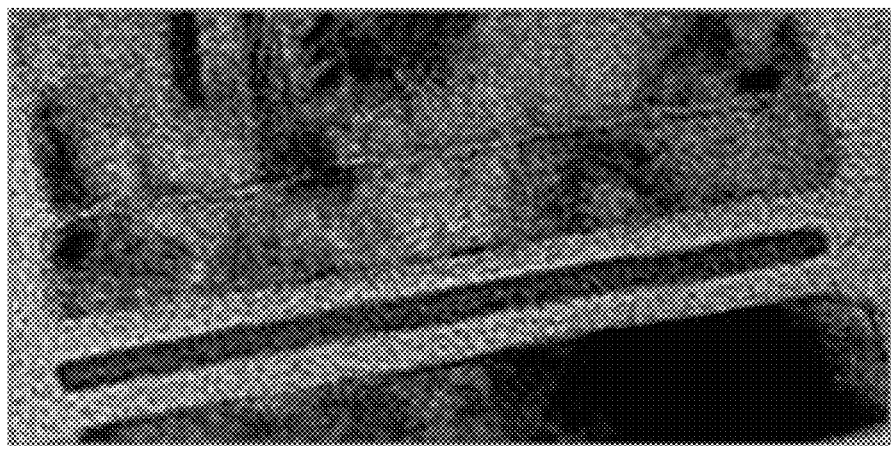
FIG. 4c illustrates a magnified view of the cell of FIG. 4b.

FIG. 4b illustrates a gate structure of the memory device in an embodiment of the invention or a gate structure formed by a method according to an embodiment of the invention showing the extent of encroachment has been substantially reduced over that experienced in the gate structures that have not been produced having an amorphous silicon layer separating the dielectric layer from the polysilicon control gate. FIG. 4c illustrates a magnified view of the cell of FIG. 4b.

In the exemplary embodiment of FIGS. 4b and 4c, an amorphous silicon layer 300 Å thick decreases the extent of encroachment to 60 Å and 61 Å, the second thickness, above the 52 Å, the first thickness, of the upper oxide film of the dielectric layer. This results in a comparative reduction of from 71 Å and 67 Å of encroachment shown in FIG. 4a to 60 Å to 61 Å of encroachment over the 52 Å thickness of the upper oxide film of the dielectric layer. Thus, the extent of encroachment is reduced from about 19 Å and 15 Å to about 8 Å and 9 Å. According to this exemplary embodiment, a reduction of from about 40% to about 60% is realized in the encroachment.

In certain embodiments of the invention, the reduction in encroachment can be substantially reduced or result in a reduction of at least about 10%, at least about 20%, at least about 30% at least about 40%, at least about 60%, at least about 70%, at least about 80%, at least about 90%, and up to at least about 100% or more. In certain embodiments of the invention, there is no encroachment in the gate structure of the inventive memory device or in the gate structure of a memory device produced according to methods of the invention.

In an embodiment of the invention, the ratio of second thickness of the second oxide layer to the first thickness of the second oxide layer is less than about 1.45, less than about 1.40, less than about 1.35, less than about 1.32, less than about 1.30, less than about 1.27, less than about 1.25, less than about 1.22, less than about 1.20, less than about 1.17, less than about, 1.15, less than about 1.12, less than about 1.10, less than about 1.09, less than about 1.07, and less than about 1.05. According to an embodiment of the invention, the second thickness of the second oxide layer is about the same as the first thickness of the second oxide layer.

The extent of reduction in encroachment resulting from cell oxidation in the inventive memory device or memory device manufactured according to a method of the invention may be caused by any cell reoxidation process including, but not limited to, dry oxidation, wet oxidation, in-situ steam generation (ISSG), as well as other types of oxidation.

The inventive methods of production may also be applied to other semiconductor devices that may experience encroachment as a result of being subjected to cell reoxidation procedure, any oxidation procedure, or even any thermal procedure for that matter.

According to other embodiments of the invention, the dielectric spacer may be replaced with another material, such as, for example, high density plasma or any other material that prevents the need an oxidative treatment step. Pursuant to these embodiments, materials may be used that may be further processed using, for example, thermal annealing, which does not necessarily need to be carried out in an oxidative atmosphere.

In yet other embodiments of the invention, other processing techniques may be utilized to prevent the formation of or substantially reduce the extent of encroachment experienced in a semiconductor device. In certain embodiments, metal oxide semiconductor (MOS) layered technology may be used to replace the polysilicon layer and provide the needed impedance of the device.

In certain embodiments, the spacer may comprise other materials that are less prone to encroachment. For example, the spacer may be replaced by a high density plasma (HDP).

Without intending to be bound by theory, the inventors have further discovered that the concentration of phosphorus ions at the interface where the dielectric layer and the next layer, which may either include a polysilicon layer representing the control gate or another layer, such as an amorphous layer, of the present invention. The phosphorus concentration is a rudiment of an n-p doping process of the control gate. The doping process enhances conductivity across the gates ensuring a more efficient writing and/or erasing operation.

As further explained herein, FIG. 4a illustrates the extent of encroachment in a gate structure, while FIGS. 4b-4c illustrates a substantially reduced extent of encroachment in a gate structure of the invention or a gate structure that has been manufactured according to the methods of the invention. The gate structure of FIGS. 4b-4c has a layer comprised of a phosphorus dopant applied at 40 keV at a dose of $5\times10^5$ cm$^{-2}$.

A person of ordinary skill in the art given the benefit of this disclosure would understand that other types of doping using phosphorous or any other dopant may be used in the invention. For example, doping may be accomplished using other dopants at different applied energies and at varying doses to achieve the extent of doping required by the memory device.

Figure 4D:
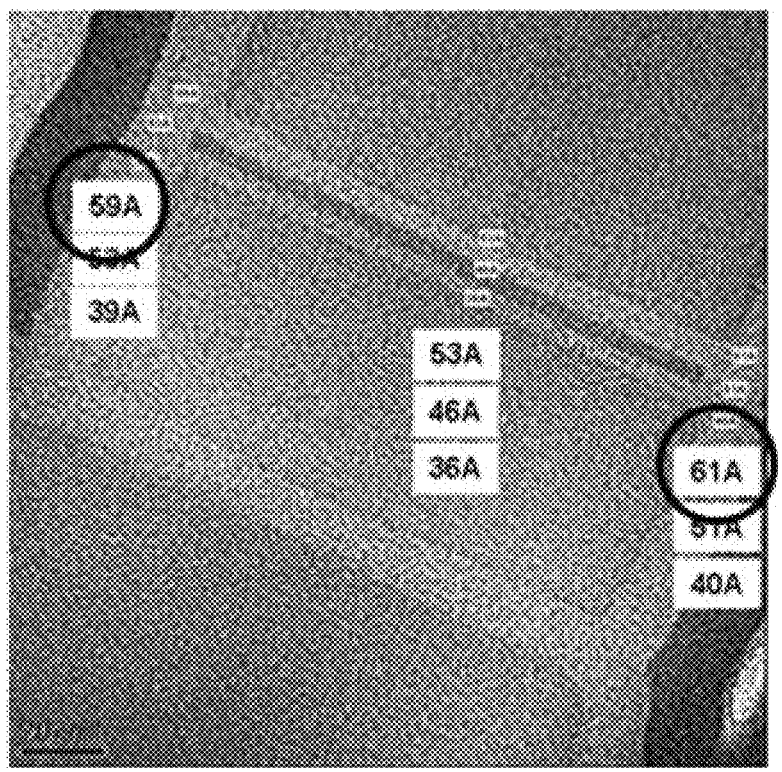
FIG. 4d illustrates a cell without a n-p doped (NAP) implant that is substantially free of dielectric encroachment.

FIG. 4d illustrates a cell without a n-p doped (NAP) implant that is substantially free of dielectric encroachment similar to the illustration of the cell in FIGS. 4b-4c that employs the inventive technique. Hence, without being bound by theory, including the amorphous implant appears that it may reduce the phosphorus concentration of a doped cell at the interface of the dielectric and the amorphous layer.

Figure 5:
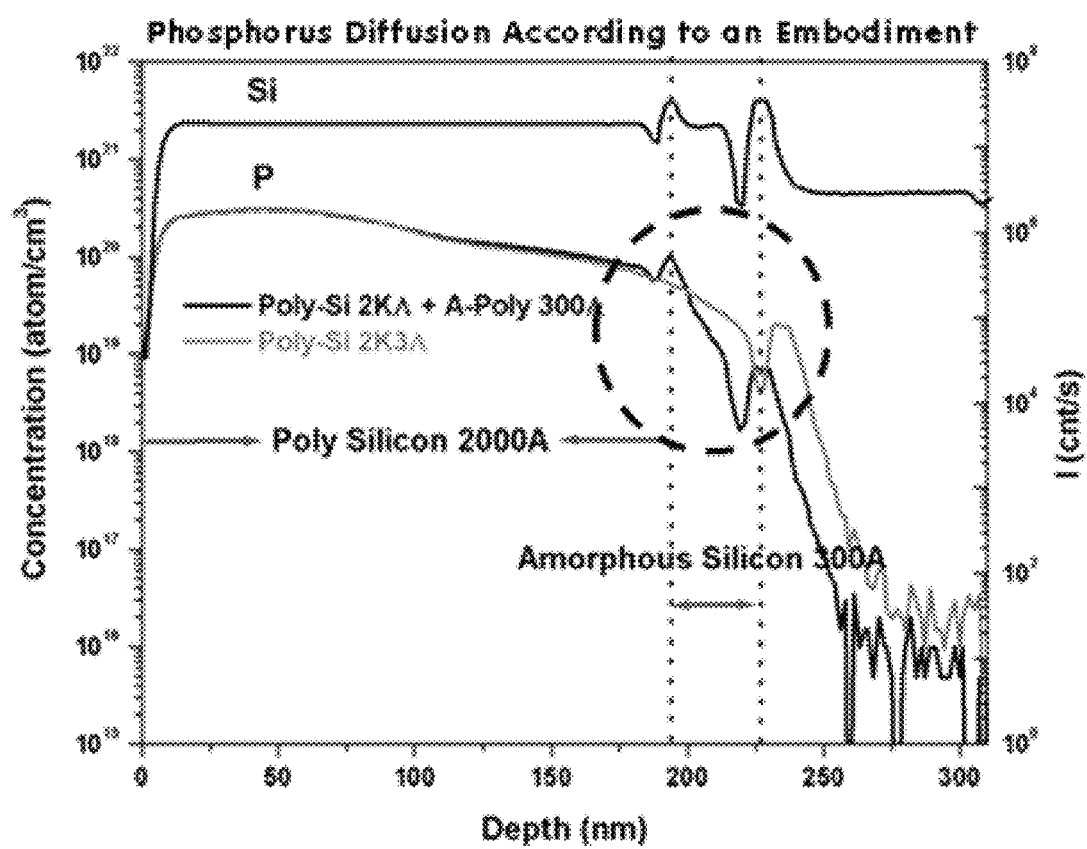
FIG. 5 illustrates a graphical representation of a phosphorous concentration profile across a polysilicon layer and an amorphous silicon layer according to an embodiment of the invention.

FIG. 5 is a graphical representation of a phosphorous concentration profile, according to an embodiment of the invention, obtained using second ion mass spectrometry (SIMS). As FIG. 5 illustrates, the phosphorus dopant gathers at the polysilicon-to-amorphous silicon interface allowing lower concentrations of the phosphorus dopant to be observed at the interface between the amorphous silicon layer and the dielectric layer.

Figure 6A:
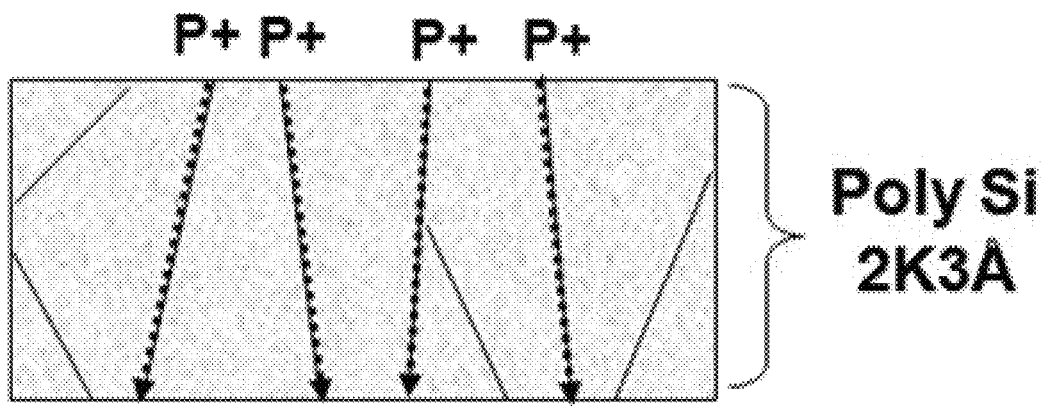
FIG. 6a illustrates phosphorus diffusion behavior in a polysilicon layer.

FIG. 6a is an illustration of phosphorus dopant diffusion behavior in a 2000 Å polysilicon layer. According to FIG. 6a, the dopant diffuses without any interfacial disruption.

Figure 6B:
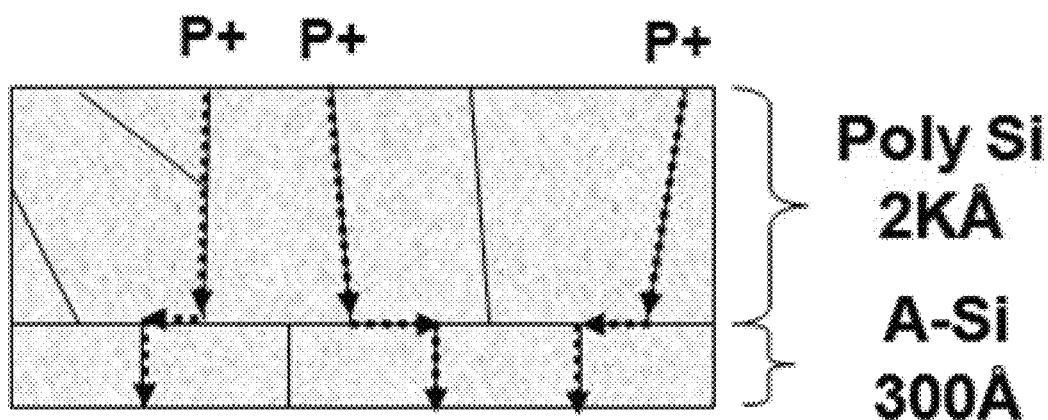
FIG. 6b illustrates phosphorus diffusion behavior according to an embodiment of the invention.

FIG. 6b is an illustration of phosphorus diffusion in the gate structure of an embodiment of the invention consisting of a 2000 Å polysilicon layer followed by a 300 Å amorphous silicon layer. According to FIG. 6b, the gate structure of this embodiment extends the phosphorus diffusion length due to the discontinuous grain boundary that exists at the interface of the polysilicon layer and the amorphous polysilicon layer helping to create the profile observed in FIG. 5.

According to an embodiment of the invention, the multi-polysilicon layer comprises at least one layer of a polysilicon suitable for the formation of a control gate having a thickness of at least about 50 Å, at least about 100 Å, at least about 200 Å, at least about 300 Å, at least about 400 Å, at least about 500 Å, at least about 600 Å, at least about 800 Å, at least about 1000 Å, at least about 1200 Å, at least about 1400 Å, at least about 1500 Å, at least about 1600 Å, at least about 1800 Å, at least about 2000 Å, at least about 2200 Å, at least about 2500 Å, at least about 2800 Å, at least about 3000 Å, at least about 3500 Å, at least about 4000 Å, at least about 4500 Å, and at least about 5000 Å.

According to an embodiment of the invention, the multi-polysilicon layer comprises at least one amorphous layer of amorphous silicon having a thickness of at least about 5 Å, at least about 10 Å, at least about 20 Å, at least about 30 Å, at least about 40 Å, at least about 50 Å, at least about 60 Å, at least about 80 Å, at least about 100 Å, at least about 120 Å, at least about 140 Å, at least about 150 Å, at least about 160 Å, at least about 180 Å, at least about 200 Å, at least about 220 Å, at least about 250 Å, at least about 280 Å, at least about 300 Å, at least about 350 Å, at least about 400 Å, at least about 450 Å, at least about 500 Å, at least about 600 Å, at least about 700 Å, at least about 800 Å, at least about 900 Å, and at least about 1000 Å.

In certain embodiments of the invention, the multi-polysilicon layer is constructed to achieve at least about 50%, at least about 60%, at least about 70%, at least about 80%, at least about 90%, at least about 91%, at least about 92%, at least about 93% at least about 94%, at least about 95%, at least about 96%, at least about 97%, at least about 98%, at least about 99%, at least about 99.1%, at least about 99.2%, at least about 99.3%, at least about 99.4%, at least about 99.5%, at least about 99.6%, at least about 99.7%, at least about 99.8%, at least about 99.9%, at least about 99.91%, at least about 99.92%, at least about 99.93%, at least about 99.94%, at least about 99.95%, at least about 99.96%, at least about 99.97%, at least about 99.98%, and at least about 99.99% reduction in concentration of dopant at the interface of the amorphous silicon layer and the dielectric layer versus the peak concentration of dopant in the bulk material. In certain embodiments of the invention, the multi-polysilicon layer is constructed to achieve at least about a 99.999%, at least about 99.9995%, and at least about 99.9999% reduction in concentration of dopant at the interface of the amorphous silicon layer and the dielectric layer versus the peak concentration of dopant in the bulk material.

In another embodiment of the invention, a small grain size polysilicon is used instead of the amorphous silicon layer to form a gate structure having an oxide-nitride-oxide layer/small grain size polysilicon layer/large grain size polysilicon layer structure—i.e., the grain size of the large grain size polysilicon layer is larger than the grain size of the small grain size polysilicon layer.

Figure 7:
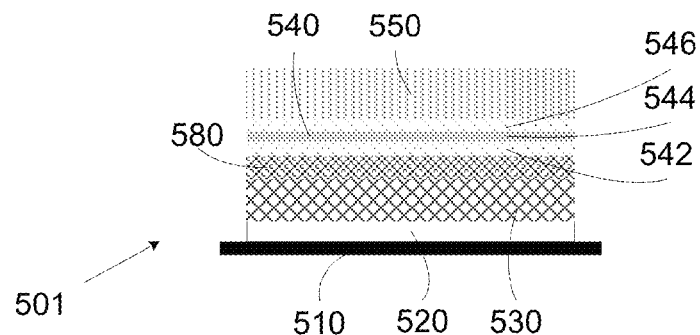
FIG. 7 illustrates an embodiment of the invention whereby an amorphous silicon layer is disposed between a lower conductive layer and a dielectric layer.

According to another embodiment of the invention, an amorphous silicon layer may be disposed between a lower conductive layer, such as a floating gate, and a dielectric layer. As illustrated in FIG. 7, a gate structure 501 comprises a substrate 510 and a tunnel oxide layer 520. A lower conductive layer 530, such as a floating gate, is adjacent to the tunnel oxide layer 520, and an amorphous silicon layer 580 is deposited substantially along the lower conductive layer 530. The amorphous silicon layer 580 may be deposited according to any of the techniques and specifications as defined herein. A dielectric layer 540, having, for example, a lower oxide film 542, a nitride film 544, and an upper oxide film 546, follows the amorphous silicon layer 580. An upper conductive layer 550 may be disposed over the dielectric layer 540.

Figure 8:
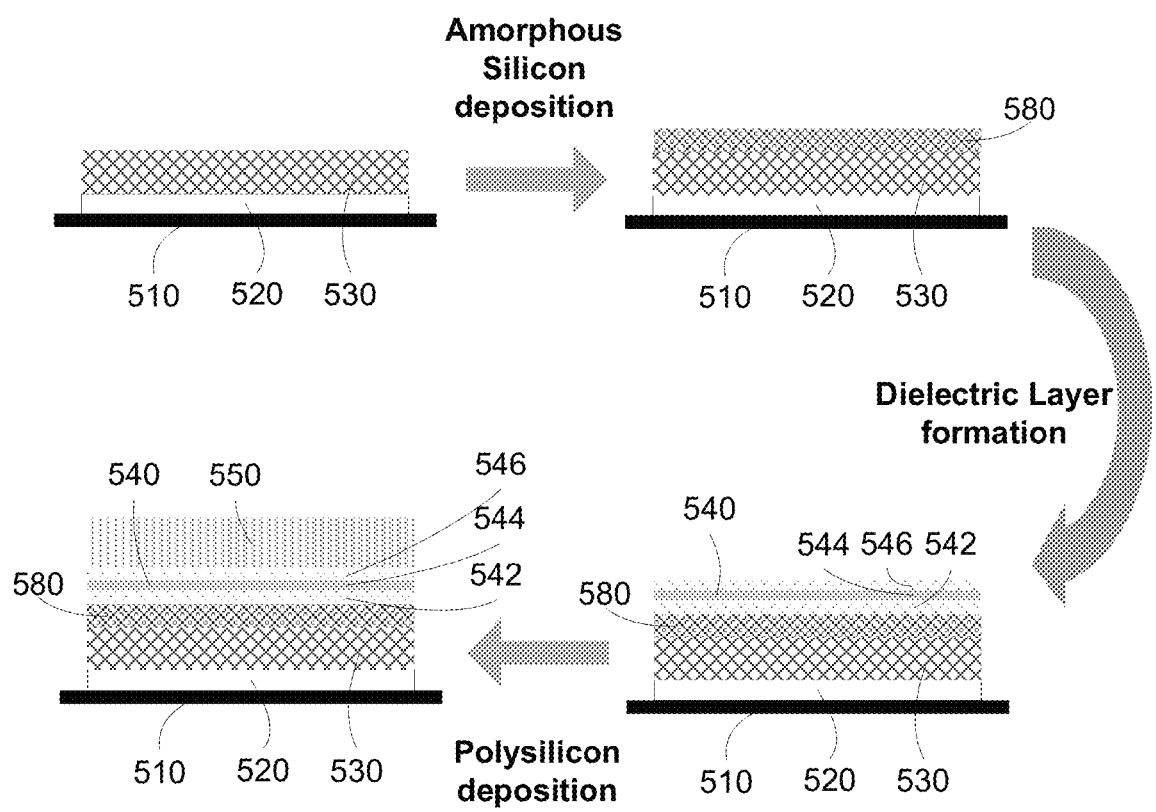
FIG. 8 illustrates amorphous silicon deposition followed by formation of a dielectric layer according to an embodiment of the invention.

FIG. 8 illustrates an exemplary process for forming a semiconductor device pursuant to the aforementioned embodiment of the invention. Beginning with a semiconductor component having a tunnel oxide layer 520 that has been formed upon a substrate 510 and a lower conductive layer 530 that has been formed upon the tunnel oxide layer 520, the process further includes the steps of depositing an amorphous silicon layer 580 and forming a dielectric layer 540. According to an embodiment of the invention, the dielectric layer 540 may be formed to resemble a laminated structure having a lower oxide film 542, a nitride film 544, and an upper oxide film 546. A polysilicon layer, such as, for example, through polysilicon deposition, may be applied to the dielectric layer 540 to form an upper conductive layer 550. In certain embodiments of the invention, the upper conductive layer 550 may function as a control gate.

Figure 9:
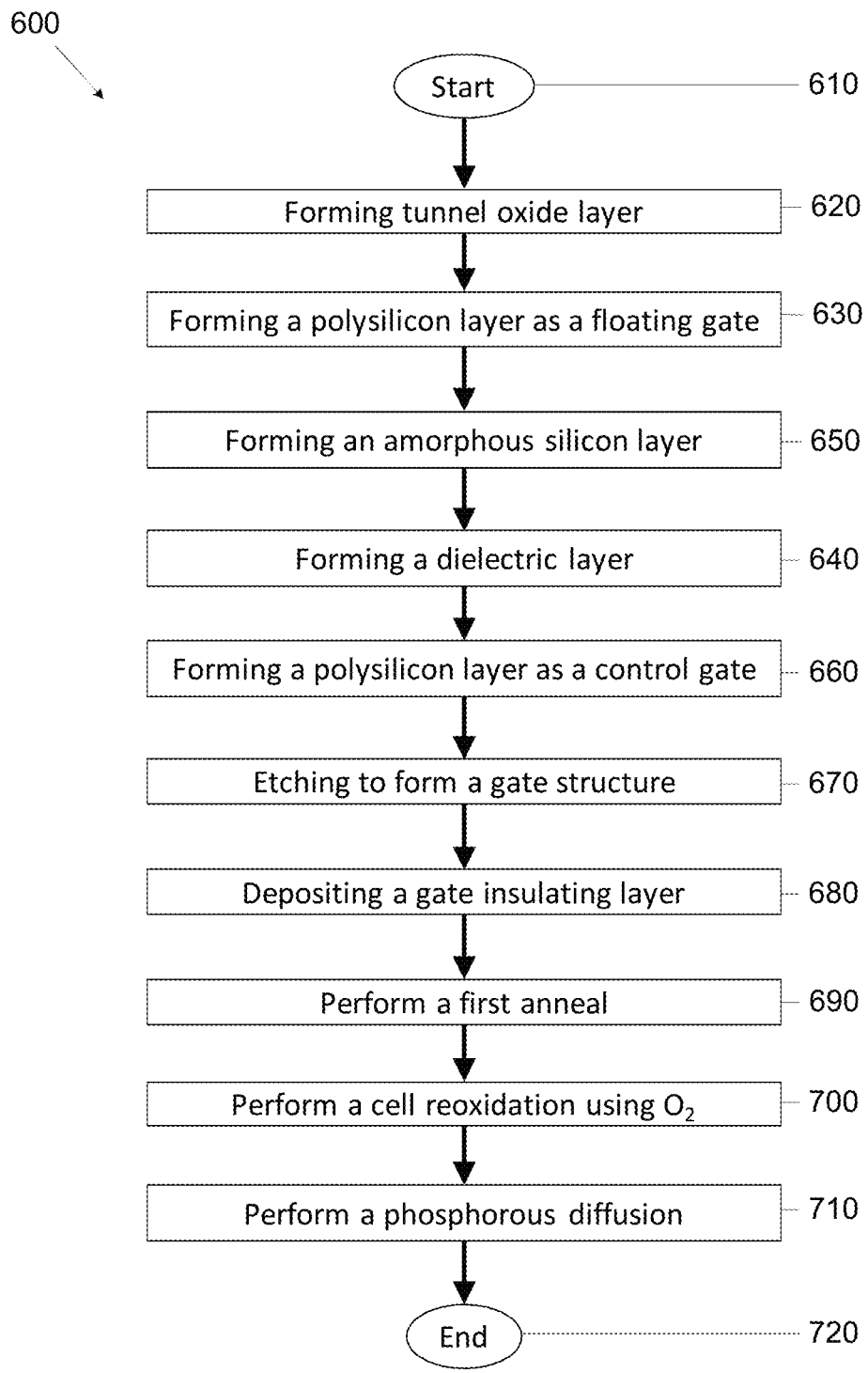
FIG. 9 illustrates amorphous silicon deposition followed by formation of a dielectric layer according to an exemplary embodiment of the invention.

An exemplary process of forming a semiconductor device having an amorphous silicon layer disposed between a lower conductive layer and a dielectric layer may resemble the process illustrated in FIG. 3 except that the steps of forming an amorphous silicon layer 350 precedes the step of forming a dielectric layer 340. FIG. 9 illustrates a process flow diagram showing an embodiment where amorphous silicon deposition is followed by formation of a dielectric layer. According to this exemplary embodiment, a method for fabricating or manufacturing a gate structure 600 of a memory device begins with providing the materials needed to form the gate structure 610. The inventive method 600 includes the step of forming a tunnel oxide layer 620 onto a substrate, followed by forming a floating gate 630, which may be itself constructed of a polysilicon layer over the tunnel oxide layer. This step is then followed by the step of forming an amorphous silicon layer 650. A next step in the inventive method 600 includes forming a dielectric layer 640. A control gate is added by forming a polysilicon layer 660 over the dielectric layer.

In some embodiments of the invention, the dielectric layer is similar to a lamination structure having a lower oxide film, a nitride film, and an upper oxide film. Any technique known in the art may be used in forming the dielectric layer 640. By way of example, without intending to be limiting, the films of the dielectric layer may be formed by a series of chemical vapor deposition operations in forming the lamination structure of the dielectric layer.

The inventive method 600 also includes etching to form a gate structure 670, depositing a gate insulating layer 680, performing a first anneal 690, and performing a cell reoxidation using oxygen 700. Subsequently, the inventive method may include performing a diffusion step such as a phosphorus diffusion step 710. The inventive process concludes with the formation of a gate structure 720 that is substantially free of encroachments in the dielectric layer.

Any of the processes, methods, or techniques as described herein may be used to accomplish any of these steps of the inventive method 600.

In a non-limiting example, according to an embodiment of the invention, a gate structure of a memory device may comprise a dielectric layer and an upper conductive layer, the upper conductive layer being defined by at least two layers. Each of the at least two layers may have a material having a grain size that is different for each of the layers. Each of the two layers will also be defined by a dopant concentration that is different for each of the layers. Pursuant to this embodiment of the invention, one layer of the upper conductive layer may have a large grain size material and another layer of the upper conductive layer may have a small grain size material. Further pursuant to this embodiment of the invention, the dopant concentration of the layer having the large grain size material is greater than the dopant concentration of the layer having the small grain size material.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A gate structure for a memory device comprising:
    a substrate;
    an oxide/nitride/oxide (ONO) dielectric layer;
    an amorphous silicon layer physically contacting with the ONO dielectric layer;
    a conductive layer; and
    another amorphous silicon layer and another conductive layer,
    wherein the amorphous silicon layer is disposed between the ONO dielectric layer and the conductive layer and the ONO dielectric layer is disposed between the substrate and the amorphous silicon layer,
    wherein the conductive layer is polysilicon, and
    wherein the another amorphous silicon layer is disposed between the ONO dielectric layer and the another conductive layer.

2. The gate structure of claim 1, wherein the conductive layer is an upper conductive layer.

3. The gate structure of claim 1, wherein the amorphous silicon layer has a thickness in a range of from about 50 Å to about 1000 Å.

4. The gate structure of claim 3, wherein the thickness of the amorphous silicon layer is about 300 Å.

5. The gate structure of claim 2, wherein the ONO dielectric layer comprises a first oxide layer, a nitride layer, and a second oxide layer, wherein the nitride layer is disposed between the first oxide layer and the second oxide layer, and the second oxide layer is defined by a first thickness at about a middle of the ONO dielectric layer and a second thickness at about an outside periphery of the ONO dielectric layer.

6. The gate structure of claim 5, wherein a ratio of the second thickness to the first thickness is less than about 1.35.

7. The gate structure of claim 5, wherein the first thickness is substantially the same as the second thickness.

8. The gate structure of claim 2, wherein the another conductive layer is a lower conductive layer adjacent to the ONO dielectric layer.

9. A gate structure for a memory device comprising:
    a dielectric layer;
    an amorphous silicon layer;
    a conductive layer; and
    another amorphous silicon layer and another conductive layer,
    wherein the amorphous silicon layer is disposed between the dielectric layer and the conductive layer and the another amorphous silicon layer is disposed between the dielectric layer and the another conductive layer, and
    wherein the conductive layer and another conductive layer comprise polysilicon.

10. A method for manufacturing a gate structure of a memory device comprising
    forming a tunnel oxide layer onto a substrate,
    forming a lower conductive layer over the tunnel oxide layer,
    forming an oxide/nitride/oxide (ONO) dielectric layer over the lower conductive layer,
    forming an amorphous silicon layer over the ONO dielectric layer,
    forming a polysilicon layer over the amorphous silicon layer,
    etching the polysilicon layer to form the upper conductive layer,
    depositing an insulating layer over the upper conductive layer,
    performing a first anneal of the gate structure, and
    performing a cell reoxidation in the presence of oxygen.

11. The method of claim 10, wherein the amorphous silicon layer is formed using a chemical vapor deposition process, the chemical vapor deposition process is selected from any one of a plasma-enhanced chemical vapor deposition, a plasma-assisted chemical vapor deposition, a plasma-promoted chemical vapor deposition, a low pressure chemical vapor deposition, and an atmospheric pressure chemical vapor deposition.

12. The method of claim 11, wherein a temperature of the chemical vapor deposition step is in a range of from about 400° C. to about 700° C.

13. The method of claim 11, wherein a pressure of the chemical vapor deposition step is in a range of from about 0.2 torr to about 760 torr.

14. The method of claim 13, wherein the amorphous silicon layer has a thickness in a range of from about 50 Å to about 1000 Å.

15. The method of claim 10, wherein the ONO dielectric layer comprises a first oxide layer, a nitride layer over the first oxide layer, and a second oxide layer over the nitride layer, the second oxide layer being defined by a first thickness at about a middle of the ONO dielectric layer and a second thickness at about an outside periphery of the ONO dielectric layer.

16. The method of claim 15, wherein a ratio of the second thickness to the first thickness is less than about 1.35.

17. The method of claim 10, wherein a temperature of performing the first anneal is in a range of from about 500° C. to about 1,200° C. and a pressure of performing the first anneal is in a range of from about 0.2 torr to about 760 torr.

18. The method of claim 10, wherein performing the first anneal is in an atmosphere comprising at least one of nitrogen and argon.

19. A method for manufacturing a gate structure of a memory device comprising
    forming a tunnel oxide layer onto a substrate,
    forming a lower conductive layer over the tunnel oxide layer,
    forming a dielectric layer over the lower conductive layer,
    forming an amorphous silicon layer over the dielectric layer, forming an upper conductive layer, which is a polysilicon layer, over the amorphous silicon layer,
    etching the polysilicon layer to form the upper conductive layer,
    depositing an insulating layer over the etched polysilicon layer,
    performing a first anneal of the gate structure, and
    performing a cell reoxidation in the presence of oxygen.

20. The method of claim 19, wherein the amorphous silicon layer is formed using a chemical vapor deposition process, the chemical vapor deposition process is selected from any one of a plasma-enhanced chemical vapor deposition, a plasma-assisted chemical vapor deposition, a plasma-promoted chemical vapor deposition, a low pressure chemical vapor deposition, and an atmospheric pressure chemical vapor deposition.

21. The method of claim 20, wherein a temperature of the chemical vapor deposition step is in a range of from about 400° C. to about 700° C.

22. The method of claim 20, wherein a pressure of the chemical vapor deposition step is in a range of from about 0.2 torr to about 760 torr.

23. The method of claim 22, wherein the amorphous silicon layer has a thickness in a range of from about 50 Å to about 1000 Å.

24. The method of claim 19, wherein a temperature of performing the first anneal is in a range of from about 500° C. to about 1,200° C. and a pressure of performing the first anneal is in a range of from about 0.2 torr to about 760 torr.

25. The method of claim 19, wherein performing the first anneal is in an atmosphere comprising at least one of nitrogen and argon.

* * * * *